US006980030B1

(12) United States Patent
Wirtz, II et al.

(10) Patent No.: US 6,980,030 B1
(45) Date of Patent: Dec. 27, 2005

(54) EMBEDDED FUNCTION UNITS WITH DECODING

(75) Inventors: Frank C. Wirtz, II, Corrales, NM (US); John R. Hubbard, Albuquerque, NM (US); Jeffrey H. Seltzer, Los Gatos, CA (US); Schuyler E. Shimanek, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 109 days.

(21) Appl. No.: 10/606,610

(22) Filed: Jun. 26, 2003

(51) Int. Cl.[7] .......................... H03K 19/177
(52) U.S. Cl. ....................... 326/41; 326/105
(58) Field of Search .................. 326/37–41, 46–47, 326/105

(56) References Cited

U.S. PATENT DOCUMENTS

| | | | | |
|---|---|---|---|---|
| 5,226,063 A | * | 7/1993 | Higashitsutsumi | 377/44 |
| 5,426,379 A | * | 6/1995 | Trimberger | 326/39 |
| 5,777,946 A | * | 7/1998 | Inuzuka et al. | 365/240 |
| 5,821,772 A | * | 10/1998 | Ong et al. | 326/38 |
| 6,288,570 B1 | * | 9/2001 | New | 326/41 |

OTHER PUBLICATIONS

XILINX™, CoolRunner-II™, CPLD Family Data Sheet ("CoolRunner-II Data Sheet"), Advanced Product Specification, DS090, (v1.3), Sep. 24, 2002.

* cited by examiner

Primary Examiner—James H. Cho
(74) Attorney, Agent, or Firm—Scott R. Brown; LeRoy D. Maunu; Justin Liu

(57) ABSTRACT

Integrated circuits are disclosed that have interconnected programmable logic, and configuration memory. The interconnected programmable logic is connected by a logical interconnection network. The integrated circuits have a configurable function unit including a function unit component, such as a counter or shift register. The integrated circuits further include a configurable decoder, which decodes a value presented by the function unit component based on decoder configuration data. The integrated circuits also have at least one decoder output, which provides information about a comparison of the decoder configuration data with the value presented by the function unit component.

46 Claims, 4 Drawing Sheets

EMBEDDED FUNCTION UNITS WITH DECODING

FIELD OF THE INVENTION

The present invention relates to programmable logic devices, and more particularly to improved programmable logic devices that provide specialized hardware counters, shift registers, and/or other hardware configurable function units within sections of programmable logic.

BACKGROUND

Programmable logic devices such as Field Programmable Gate Arrays ("FPGA") and Complex Programmable Logic Devices ("CPLD") are widely used because of their inherent speed, size, power, and flexibility advantages. However, an aspect of the inherent flexibility of programmable logic is that there is a corresponding built-in hardware complexity associated with programmable logic. Even though not every type of gate or interconnection is needed for any given design, a complete set of configurable logic must be provided in a configurable logic device so that a programmable logic device can be programmed to carry out any arbitrary function. Accordingly, in a particular digital logic design, much of the available circuitry in a CPLD or FPGA can go unused.

Many programmable logic designs employ the logical functions of counters and/or shift registers to accomplish various functions. Counters can be used for several purposes, including as clock dividers, as scaling elements, for timing, and to provide time-windowing functions. In one estimate, more than 50% of all designs incorporate at least one counter. Shift registers are also commonly used, and have various uses including, for example, FIFO's for serial communication.

In order to build, for example, a counter or shift register ("function unit") in programmable logic, users of programmable logic have heretofore needed to create such a function unit using programmable logic elements, such as general purpose product terms and macrocells or logic blocks that could, ideally, be used for other aspects of the digital design. Accordingly, while function units can be implemented in programmable logic, when they are so implemented, much of the underlying programmable hardware is consumed by the function units, leaving reduced programmable logic for the remainder of the design, or otherwise requiring undesirably large amounts of programmable logic. Programmable logic elements would ideally be used for custom aspects of a particular design, rather than for commonly recurring function units. Accordingly, there is a need for programmable logic devices that provide configurable function units, such as counters and shift registers, without necessitating the use of conventional programmable logic resources to implement the configurable function units.

SUMMARY OF THE INVENTION

Integrated circuits are provided that have interconnected programmable logic, configuration memory, and external inputs and outputs. The interconnected programmable logic is connected through a logical interconnection network. The integrated circuits include a configurable function unit including a function unit component such as a counter or shift register. The integrated circuits further include a configurable decoder, which decodes a value presented by the function unit component based on decoder configuration data. The integrated circuits also include at least one decoder output, which provides information about a comparison of the decoder configuration data with the value presented by the function unit component.

DETAILED DESCRIPTION

Programmable logic devices are provided that include dedicated, user configurable function units, which function, for example, as decodable counters. In one embodiment, the counter counts up. In one embodiment, a counter is provided in each function block of a CPLD. In this embodiment, the counter includes hardware to provide a synchronous counter. The exemplary decodable counter block shares input resources with a particular macrocell in each function block of the CPLD. These signals, which are normally provided to and used by the macrocell, are shared by the function unit, facilitating ease of configuration and reducing silicon size. Shared signals include, for example: clock, clock enable, asynchronous reset, asynchronous preset, and the data input to the macrocell.

Decodable counter blocks consistent with the present invention are capable of implementing a synchronous reset function. Synchronous reset is a reset of the internal value of the counter that occurs synchronously in connection with a clock signal, which synchronizes operation of the CPLD. In one embodiment, the output of a counter is decoded in connection with an associated decoder to determine when a particular value has been reached within the counter. In one embodiment, at least two such decoding structures are provided in each function unit, in connection with each counter, so that at least two independent count values can be used for such purposes as count windowing to provide time-window indication support. Optionally, a third decoder structure is provided to reset the counter block such that a user defined terminal count is utilized to reset the counter when it reaches the associated terminal count.

Figure 1:
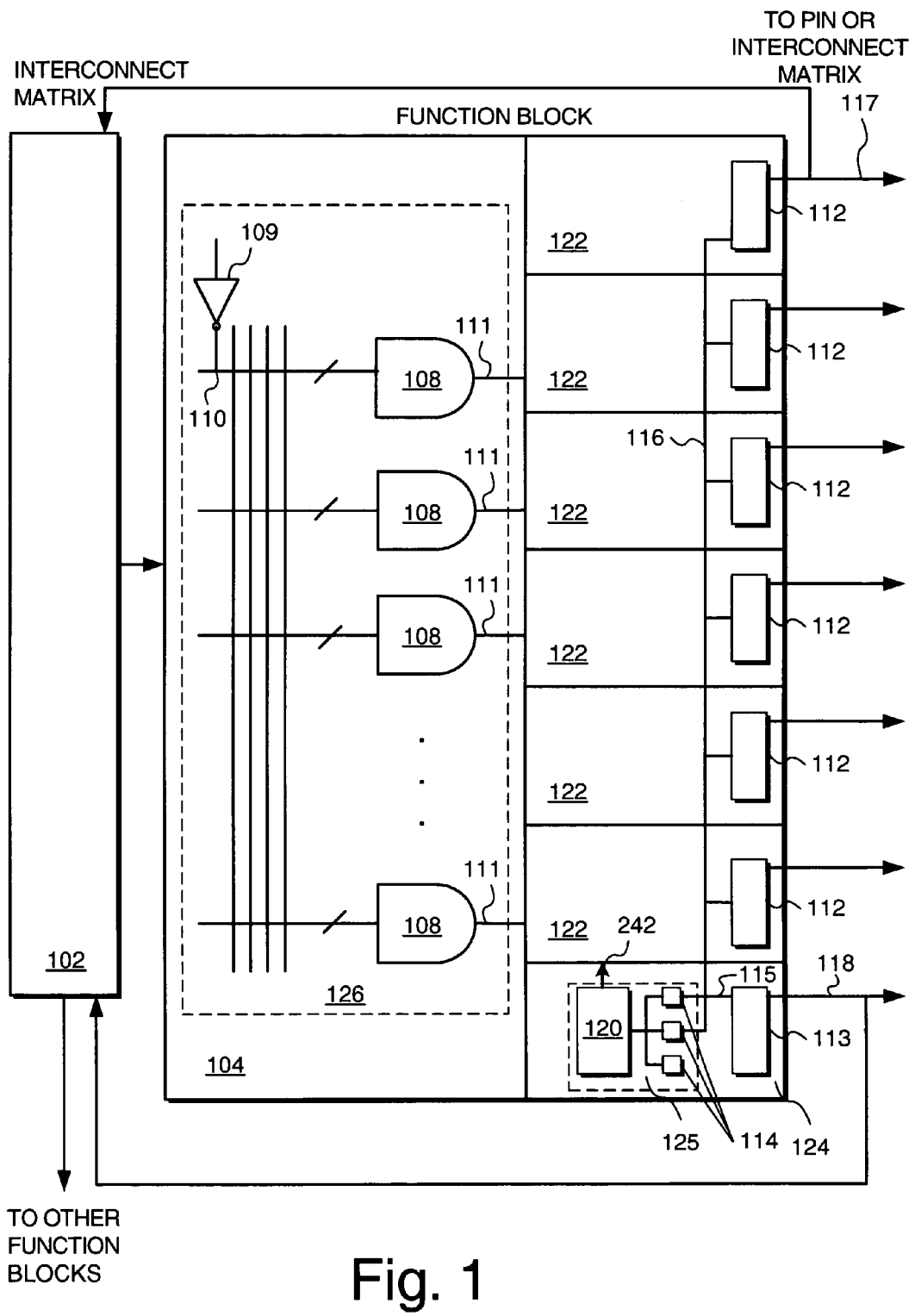
FIG. 1 is a block diagram showing portions of a CPLD consistent with the present invention including an interconnect matrix and a function block having a set of macrocells.

FIG. 1 is a block diagram showing portions of a CPLD consistent with the present invention. The CPLD includes an interconnect matrix 102 to route internal signals between function block 104 and other function blocks within the CPLD. The function block 104 of FIG. 1 includes a set of conventional macrocells 122, such as the macrocells described at pages 4–5 in the Xilinx™ CoolRunner-II™ CPLD Family Data Sheet ("CoolRunner-II Data Sheet"), numbered DS090 (v1.3) Sep. 24, 2002, which is incorporated herein by reference. Product terms from logic array ("LA") 126 can be attached to at least one OR gate (not shown) inside the conventional macrocells 122. The logic function implemented in connection with the LA 126 and the conventional macrocells 122 can be purely combinatorial, or can be registered by using macrocell register 112, which operates selectably as a D or T flip-flop, or a transparent latch.

The function block 104 also has a specialized macrocell 124, which utilizes macrocell register 113 to synchronize decoder outputs with the remainder of the exemplary CPLD. In one embodiment, the interconnect matrix 102 is an Advanced Interconnect Matrix such as used in CPLDs manufactured by Xilinx of San Jose, Calif., a description of which is provided at page 5 in the CoolRunner-II Data Sheet. The interconnect matrix 102 is capable of routing outputs from other function blocks to inputs, such as input 110, associated with the function block 104. The interconnect matrix 102 is also capable of routing outputs, such as macrocell register outputs 117 and 118, to other function blocks within the CPLD.

In one embodiment, programmable logic is provided in the form of configurable product terms 111 within LA 126. LA 126 represents an array of interconnected signal paths that can be programmed to generate product terms using gates 108 and optional inverters 109. By connecting particular signals to particular gates within the LA 126, arbitrary combinatorial logic expressions can be evaluated as a sum of products within each macrocell 122, 124. LA 126 forms connections between signals connected to particular gates 108 and inverters 109 using one-time programmable techniques or using reprogrammable volatile memory or non-volatile memory configuration. It is understood that other methods of configuring a programmable logic expression, such as a programmable look-up table, can be employed in LA 126 without departing from the teachings of the present invention.

The product terms 111 within the function block 104 are routed to the macrocells 122 and 124 of the function block 104. The macrocells 122 can be configured to provide a signal from the LA 126 to a particular output pin (not shown) of the exemplary CPLD or to provide the signal to the interconnect matrix 102, by way of, for example, macrocell register output 117. The interconnect matrix 102 then routes signals to other parts of the CPLD as desired by the user. Macrocells 122 also contain a macrocell register 112, which in one embodiment, operates as an R/S flip-flop. Specialized macrocell 124 also includes a configurable function unit 125, which includes a function unit component 120, such as a counter or shift register, and at least one decoder 114. In FIG. 1, three decoders 114 are shown; however, more or fewer than three can be provided without departing from the scope of the present invention.

The decoders 114 are used to compare output values of the function unit component 120 in the function unit 125 to particular configured values. A signal corresponding to the comparison is provided at decoder output 115. In one embodiment, the decoder output 115 is provided to other macrocells 122 in the function block 104 by way of value rail 116. In this way, a decoder output can be provided to other macrocell registers 112 to facilitate using the decoder output at physical pins of the CPLD, or in connection with other function blocks, by routing the value at the value rail 116 through the interconnect matrix 102.

In one embodiment, "cascade" output 242 is provided to cascade an output of the function unit component 120 to the input of another function unit component in another function block. For example, when function unit component 120 is implemented as a 16-bit counter, and a counter of greater size than 16 bits is desired, the cascade output 242 associated with the counter is routed to the clock enable of another counter in the programmable logic device, so that when the less significant counter overflows, the more significant counter is incremented by one. The operation of the cascade output 242 is further described in connection with FIGS. 2–5. The "cascade" output can also be implemented simply using an output (e.g. 115 or 116) of one of the decoders 114. A decoder output, for example, optionally communicates on value rail 116 with a plurality of macrocells 122. Accordingly, the decoder associated with the value rail can be configured to identify rollover, most significant bit shift out, or other relevant event in applications that combine multiple function units 125 to form larger composite function units. Moreover, the "cascade" output can be used with a shifter-type function unit to combine multiple function units to provide a wider shifter. As used herein "cascade" is not limited merely to a counter overflow situation but rather is used in a generic sense to relate to the interconnection of function units to yield wider or larger composite function units.

In one embodiment, the output 118 from the macrocell register 113, which is obtained from the counter block decoding structure 114, is fed back to the interconnect matrix 102, which interconnects function blocks 104 within a programmable logic device. In this embodiment, a particular function unit 125 is associated with a specific macrocell 124 so as to facilitate direct connections between the function unit's associated decoders 114, the function unit component 120, and other macrocells 122 in the function block 104, for example by way of value rail 116. Because the configurable function unit decoders 114 are preferably implemented at the macrocell level, and therefore do not rely on the interconnect matrix 102 or the general purpose programmable logic within the programmable logic device, function unit component 120 decoding occurs independently from the remainder of the programmable logic device, and therefore does not affect the speed performance of the programmable logic device.

In one embodiment, the configurable function unit 125 is used in a specific macrocell 124 with the macrocell register 113 to synchronize the output of a decoder 114 associated with the configurable function unit 125. The output 118 from this macrocell 124 is optionally used to feed back decoded information associated with the function unit component 120 to the interconnect matrix 102. For example, a signal indicating a particular count can be decoded and fed back into the interconnect matrix 102 when the function unit component 120 is implemented as a counter. Timing characteristics of the macrocell are not adversely affected by the presence of the function unit 125, because the signals associated with the function unit 125 are self-contained and do not require use of the interconnect matrix 102 or general purpose programmable logic. While the signals associated with the function unit 125 are contained within the specialized macrocell 124, outputs from the decoders 114 can optionally be provided outside of the specialized macrocell 124 using a value rail 116, as explained below, or outside of the function block 104 using the interconnect matrix 102.

The value rail 116 provides a decoder output value to macrocell registers of macrocells 122, other than the specialized macrocell 124, in the function block 104 in order to provide the signal to other macrocells or to synchronize the value rail 116 signal with other portions of the exemplary programmable logic device. In one embodiment, outputs of the decoders 114 are synchronized such that values corresponding to the value rail 116 are optionally fed back to the interconnect matrix 102 and provided to an output pin synchronized with the clock in the programmable logic device.

In one embodiment, the specialized macrocell 124 is implemented as a "buried" macrocell, meaning a macrocell that is not directly coupled to an external output pin. Such an implementation advantageously facilitates family uniformity across varying programmable logic devices in similar packages, but having different numbers of macrocells. By providing the specialized macrocell in a "buried" macrocell, given a particular package size, a consistent number of external input/output pins remain available to the programmable logic design, regardless of the number of specialized macrocells.

Figure 2:
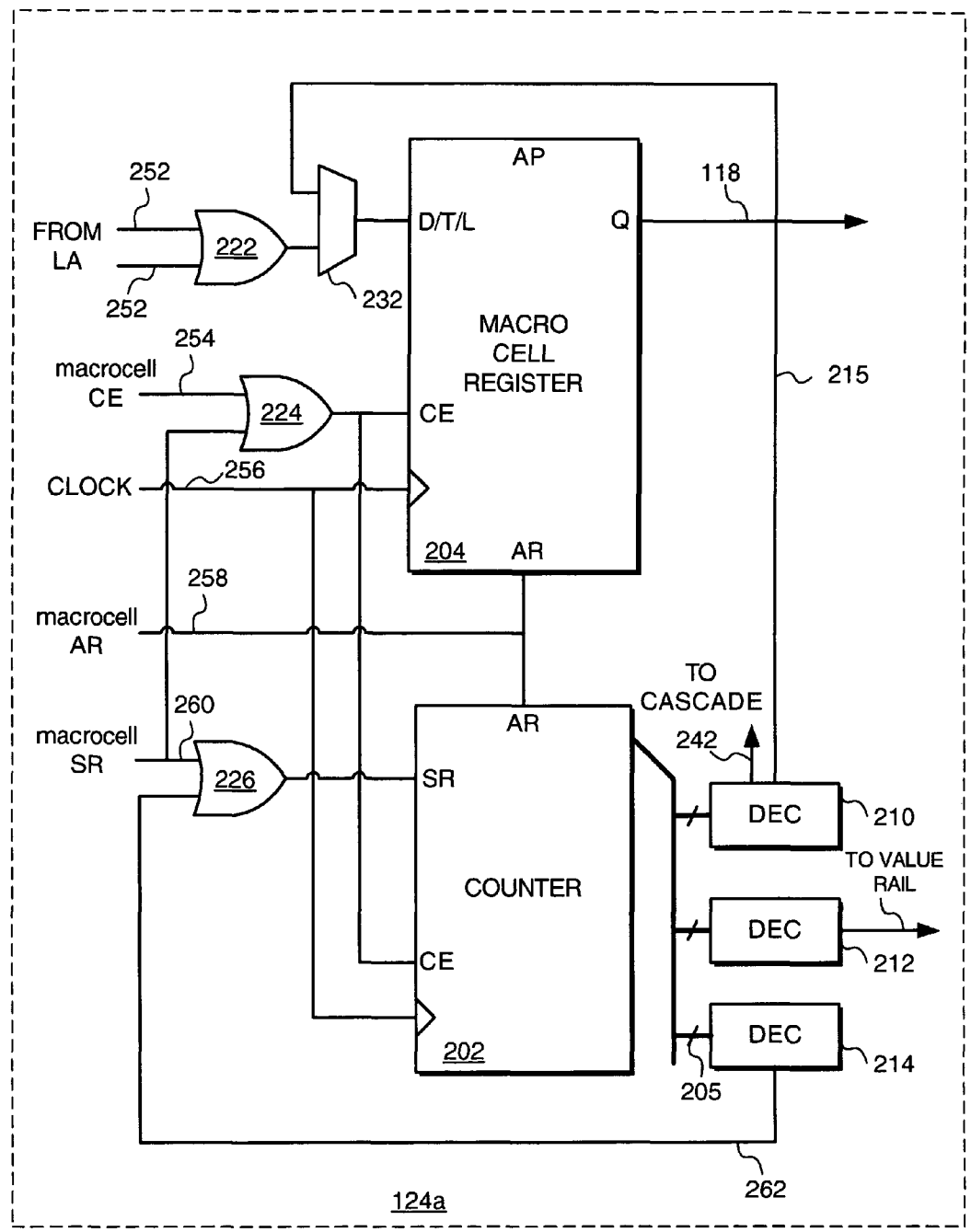
FIG. 2 is a block diagram showing portions of an exemplary specialized macrocell consistent with the present invention including a counter and associated decoders.

FIG. 2 is a block diagram showing portions of an exemplary specialized macrocell 124a consistent with the present invention including a counter 202 and associated decoders 210, 212, and 214. The specialized macrocell 124a utilizes the macrocell signals including macrocell chip enable ("CE") 254, CLOCK 256, macrocell asynchronous reset ("AR") 258, and the macrocell synchronous reset ("SR") 260 to interface the specialized macrocell, and thereby, the decodable counter, to the CPLD.

The multi-bit counter output bus 205 of the counter 202 is provided to the decoders 210, 212, and 214. The decoders 210, 212, and 214 are preferably configured at the time of initialization of the CPLD to recognize particular counter values. Alternatively, the decode values of the decoders 210, 212, and 214 are specified while the associated CPLD is in operation.

In one embodiment, decoder 214 functions so as to determine when the counter has reached a particular terminal value that is, for example, determined at the time the CPLD is configured, and decoder 214 asserts the counter's synchronous reset, through OR gate 226, when the configured terminal count has been reached. A further decoder 210 operates in connection with the macrocell register 204, which is preferably coupled with the specialized macrocell 124a and associated with the counter 202. The output of decoder 212 optionally provides the output signal to value rail 116, which can be optionally configurably accessed by the other conventional macrocells in the function block with the modified macrocell 124a. Providing a decoder output to the value rail 116 allows a user to perform windowing operations on the count data associated with the counter 202, and also allows the user to output the decoded count value to an output pin, even if the specialized macrocell 124a is a "buried" macrocell.

The value rail 116 also allows any one of the conventional macrocell outputs to correspond to a synchronized, decoded value of the counter 202, thereby allowing users to either feed a decoded count value back to the interconnect array, or to output the decoded count value to an output pin, or both. Note that any macrocell register is capable of synchronizing the decoded value of the counter 202 by providing the synchronized output to the interconnect matrix 102 or to an output pin using the functionality of the conventional macrocell input/output circuitry (not shown).

Programmable decoders 210, 212, and 214 consistent with the present invention can be implemented as AND gates with associated configurable input inverters so that they assert an output when each of their inputs correspond to the value the decoder is configured to decode. In a preferred embodiment, a decoder can also be configured to treat a particular input as "don't care", meaning the value of the "don't care" input is not used to determine when to assert the output of the decoder. Configuration and operation of decoders consistent with the present invention is further described in connection with FIGS. 4 and 5. The "don't care" bits are advantageous, for example, because they allow for the decoding of shorter serial patterns. The "don't care" bits can also allow the shifter to act as a digital delay line.

In a presently preferred embodiment, counter 202 is an up-counter of 16 bits in width. In alternative embodiments, the counter 202 is implemented with arbitrary bit-widths, and can count up or down. If the clock enable "CE" signal is asserted, then the internal value of the counter 202 will increase by one from its present value on the rising edge of CLOCK signal 256. It is understood that falling edge clocking can also be employed without departing from the teachings of the present invention. In the embodiment illustrated in FIG. 2, the counter's CE signal is asserted when CE 254 is asserted, or when the macrocell synchronous reset (macrocell "SR") 260 is asserted. The clock enable logic is provided by CE OR gate 224.

The product terms 111 from the LA 126 of FIG. 1 are received at signals 252 and summed together using OR gate 222. It is understood that the OR gate 222 can be implemented using various kinds of logic having an arbitrary number of inputs, corresponding to a size of LA 126. The result of the corresponding sum of products from the OR gate 222 is then optionally provided to the macrocell register 204 by way of programmable multiplexer 232. In the preferred embodiment, programmable multiplexer 232 is programmed at the time of configuration of the CPLD. In alternative embodiments, a memory cell or latch (not shown) that is controllable by the programmable logic is used to control the multiplexer 232. It is understood that the multiplexer 232 can be implemented so as to provide for reconfiguring the multiplexer 232 during operation of the exemplary CPLD. In one embodiment, the configuration of the multiplexer 232 determines whether the specialized macrocell 124a operates as a conventional macrocell or as a macrocell that utilizes a configurable function unit 125.

In one embodiment, other macrocell registers corresponding to other macrocells in the function block have the configurable ability to obtain register inputs from either the value rail 116, or the product term logic 252 that is normally available to the macrocell. In this embodiment, the value rail 116 is routed to the input of the conventional macrocell registers through a configurable multiplexer, similar to the multiplexer 232, which is optionally provided in each of the conventional macrocells.

Because the macrocell control signals CE 254, CLOCK 256, AR 258, and SR 260 are shared between the counter and the macrocell register, the specialized macrocell 124a can be used for normal macrocell operation, or it can be configured, using multiplexer 232, to operate as a specialized function unit macrocell.

As shown in FIG. 2, when configured to operate in decodable counter mode, specialized macrocell 124a utilizes a clock signal that is coupled with the signal identified as CLOCK 256 for both the macrocell register 204 and for the counter 202. Thus, CLOCK 256 is configurably provided from various sources within a CPLD, including: (i) from a global signal within the exemplary CPLD; (ii) from a product term 111 associated with the function block 104; (iii) from a control term within the CPLD; or (iv) from other clock resources of the CPLD, such as the CPLD system clock. Further, in the case of cascaded function units, the CLOCK 256 signal is configurably provided directly by the cascade output pin of a decoder such as decoder 210. As set forth above, cascade outputs can be implemented in various ways, including as a special output of a decoder or using the ordinary decoder output 115 or value rail 116 (shown in FIG. 1).

The macrocell CE 254 signal also operates both in connection with the macrocell register 204 and with the counter 202. When CE 254 is asserted, the counter 202 counts upwardly upon the occurrence of clock pulses. When CE 254 is de-asserted, the count value remains at the current value even when a clock pulse is received at CLOCK 256. When a macrocell is operating as a conventional macrocell and not using a function unit 125 or a value rail 116, the CE 254 signal functions in the macrocell in the ordinary manner. The use of common signals utilizing substantially congruent control inputs, regardless of whether the specialized macrocell is in conventional mode or in counter mode, greatly simplifies the software used to generate the device configuration for programming a CPLD.

The AR 258 signal provides asynchronous reset of the macrocell register 204 as well as the counter 202. When asserted, the latches in the macrocell, including the counter value and the macrocell register value, are independently and asynchronously cleared. In one embodiment, the signal ordinarily used to provide an asynchronous preset to a conventional macrocell is instead utilized as the SR 260 signal, which provides a synchronous reset of the counter 202. When SR 260 is asserted, the values of the latches in the specialized macrocell 124a, including in the counter 202 and in the macrocell register 204, are cleared upon the occurrence of the next clock edge at signal CLOCK 256.

For example, in a logic design that uses the counter 202 as a frequency divider that divides an incoming frequency by a factor of 1000, a value corresponding to 1000 can be configured in the decoder 214. In this example, when the value of counter 202 reaches 1000, the decoder 214 asserts output signal 262, which causes the output of OR gate 226 to be asserted, causing the SR input of counter 202 to be asserted, thereby causing counter 202 to be reset to zero at the next clock event of the signal CLOCK 256.

Decoders 210, 212, and 214 operate analogously to address decoders, asserting a signal on the occurrence of a predetermined value on the bus 205. Whenever a predetermined value (as configured in connection with a decoder) has been reached by the counter 202, the decoder 212 outputs, for example, a logic high level for the duration of time that the counter 202 remains at the configured count value. In an embodiment, the "don't care" states are also decoded, meaning that the bit(s) designated as "don't care" are effectively ignored during the decode process.

As illustrated in FIG. 2, in the presently preferred embodiment, three decoder structures are associated within each function block in one exemplary CPLD. Decoder 214 is used to reset the counter 202 when a terminal value has been reached. Decoders 212 and 210 are used assert a logic signal when a particular configured count value is reached in the counter 202.

In one embodiment, the decoders 210, 212, and 214 support "don't care" decode configuration bits, so that counter decoding of fewer than 16 bits can be performed, for example to assert decode output signals on value rail 116 at harmonic frequencies of the primary counter value.

In one embodiment, the configuration bits for the configuration of decoders are shared among the decoders depending on configuration of the configurable function unit 125. In this way, functionality consistent with the present invention is provided using fewer configuration bits.

When the output of decoder 212 is provided to the value rail 116, that value is not provided at the output of a macrocell register that selectively latches the value rail 116 signal until the next clock pulse to the latching macrocell register. The same is true with regard to signal 215 being latched in the macrocell register 204 within the specialized macrocell 124a. Accordingly, the value asserted at the output of the macrocell register 204 occurs one clock cycle after the configured value was detected at the counter 202. In one embodiment, in order to compensate for this additional clock cycle, the value configured in the decoders is reduced by one count at the time the decoders are programmed. Such look-ahead functionality is preferably provided in the software users use to program configurable logic; however, it is understood that the look-ahead functionality can be implemented in different ways, such as by providing circuitry that subtracts one count from the value in the counter 202 at the time the counter 202 asserts its outputs, or by causing the decoders to logically add a value of one to the compared value of the counter before carrying out the decode operation.

In one embodiment, when the specialized macrocell 124a is configured to be used in decodable counter mode, the decoders take on the configured values to decode at time of power up of the programmable logic device or other initialization. Alternatively, the values can be configured in non-volatile memory at the time the device is initially programmed.

In one embodiment, macrocell control signals such as LA product terms 252, CE 254, CLOCK 256, AR 258, and SR 260 are configurably provided only to the macrocell control register 204 when the specialized macrocell 124a is configured to operate in conventional macrocell mode. The signals are optionally, configurably routed using multiplexers (not shown) analogous to the configurable multiplexer 232. In this way, a configurable function unit component 120 in a specialized macrocell 124 can be configured to be a counter, a shift register, or another similar function unit component, such as a cyclic redundancy check ("CRC") generator, a feedback shifter, an accumulator, or a serial encrypter. In this embodiment, configuration bits are used to assign control inputs. At least one configuration bit is used to indicate whether the function unit component operates as a counter, shift register, or other type of function unit component.

The decoders each utilize a word of configuration bits sufficiently sized to accommodate decoding a particular value at the decoder. In one embodiment, two bits are used for each decoder configuration bit to accommodate the "don't care" state.

Figure 3:
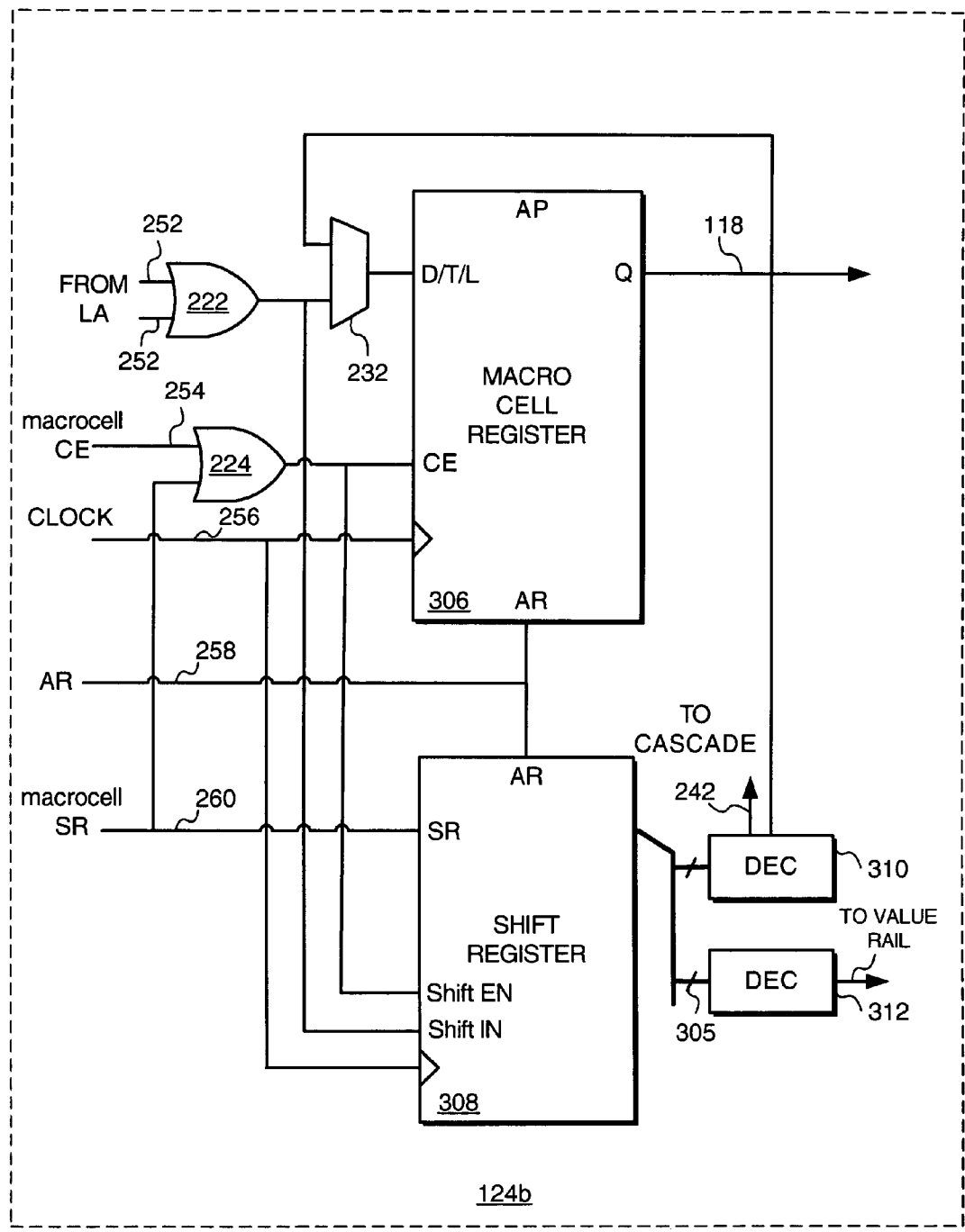
FIG. 3 is a block diagram showing portions of a specialized macrocell consistent with the present invention including a shift register and associated decoders.

FIG. 3. is a block diagram showing portions of a specialized macrocell consistent with the present invention including a shift register and associated decoders. In one embodiment, a function unit 125 is implemented as a decodable shift register as shown in FIG. 3. In such a configuration, the function unit component 120 is implemented as a linear shift register 308, with the bits of the shift register presented to at least one decoding structure, such as decoders 310, 312. Using a shift register advantageously enables the function unit 125 to be used for bit-pattern recognition, for example, which is advantageous for synchronizing serial data.

When operating in shift-register mode, a specific serial string is recognized by decoders 310 and 312 at shift-register bus 305. The decoding structures are designed to overcome the clock latency issue described in connection with FIG. 2, so that an extra clock cycle is avoided when decoding a specific pattern in the shift register 308 and providing the decoded value through a macrocell register. To accomplish this, the shift register 308 utilizes a look-ahead feature that provides, at the shift-register output bus 305, the value of, for example, all of the bits except the most significant bit in the shift register 308, shifted up, and including the least significant bit ("LSB") value at the Shift IN pin.

As described in connection with FIG. 2, when the specialized macrocell 124b is operating in shift-register mode, the LA inputs 252 are summed at OR gate 222. In shift register mode, the output of the OR gate 222 provides the LSB to the shift register 308 at the Shift IN input of the shift register 308. Alternatively, when the specialized macrocell 124b is in the conventional macrocell mode, the configurable multiplexer 232 causes the LA signals 252 to be provided through the OR gate 222 directly to the macrocell register 306, and the macrocell operates as a conventional macrocell. In either mode, the output of the macrocell register 118 is configurably provided to an input/output pin or to the interconnect matrix 102 of FIG. 1.

In shift register mode, CE 254 enables both the macrocell register 306 and the shift register 308, through the OR gate 224. In this way, the CE 254 signal operates as a shift enable, whereby a new LSB will only be shifted into the shift register 308 on a clock pulse from CLOCK 256 when the CE 254 signal is asserted. Accordingly, when CE 254 is deasserted, the shift value remains at the current state, even at the occurrence of clock event on signal CLOCK 256. AR signal 258 provides an asynchronous reset of the macrocell register 306 and of the shift register 308 independently and asynchronously from the CLOCK signal 256. When an asynchronous reset signal is received, both the value of the shift register 308 and the value of the macrocell register 306 are cleared.

In one embodiment, the signal ordinarily used to provide an asynchronous preset to a conventional macrocell is instead utilized as the SR signal 260, which provides a synchronous reset of the shift register 308, which occurs at the following clock event at signal CLOCK 256.

In the presently preferred embodiment, "don't care" bits are provided only in connection with the function unit when it is in shift-register mode. In this embodiment, the shift register 308 does not require a terminal count value as provided in counter mode shown in FIG. 2. Therefore, the configuration bits normally associated with the terminal count decoder 214 of FIG. 2 can be used to provide additional configuration bits for the "don't care" decoding of the other two decoders 310 and 312 in shift-register mode. In this embodiment, the decoder structures 310 and 312 utilize "don't care" configuration bits that are separately assigned so that the decoders 310 and 312 are capable of decoding values independently of each other.

Figure 4:
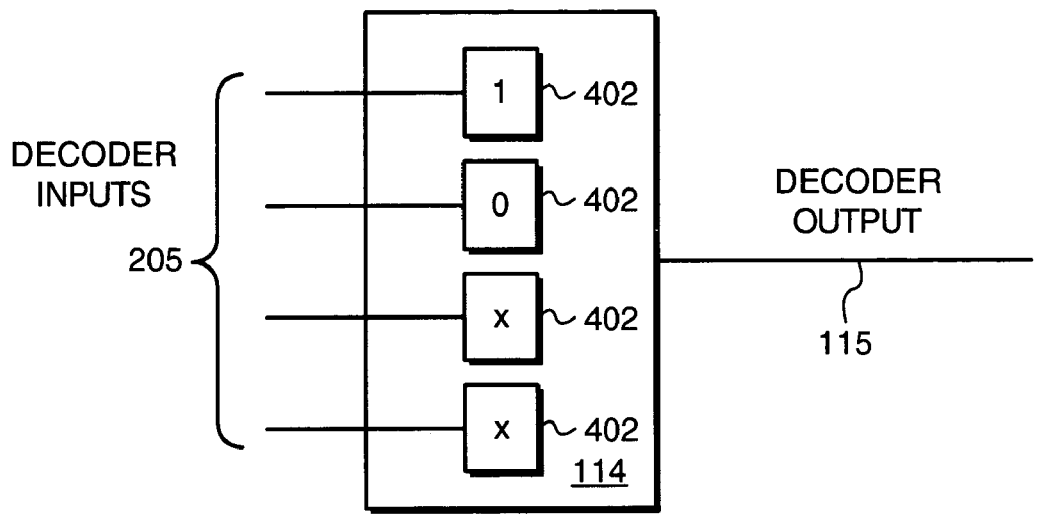
FIG. 4 is a block diagram showing a decoder consistent with the present invention, with a configured target value, including "don't care" bits.

FIG. 4 is a block diagram showing a decoder consistent with the present invention, with a configured target value, including "don't care" bits. Decoder 114 contains multiple configuration cells 402 that contain information about a corresponding input to be decoded. In the preferred embodiment the decoder configuration cells 402 are capable of representing three values, logic one, logic zero, and "don't care" (shown as an "X" in the figures), which means either logic one or logic zero. In one alternative embodiment only logic one and logic zero can be configured in connection with the configuration cells 402. In the latter case, a single configuration bit can be used to implement each of the configuration cells 402.

When decoder inputs 205 are provided to the decoder 114, the inputs 205 are decoded according to the values of the decoder configuration cells 402. In the example illustrated in FIG. 4, the output 115 of the decoder 114 will be asserted only when the topmost input of the decoder inputs is a logic one and the input below the topmost is a logic zero. The other two exemplary inputs can have any logical value without affecting whether decoder 114 asserts its output 115. In this way, serial patterns smaller than the size of the shift register can be detected. Further, harmonics of a clock divider frequency can also be generated in the counter mode using "don't care" bits, as described above.

Figure 5:
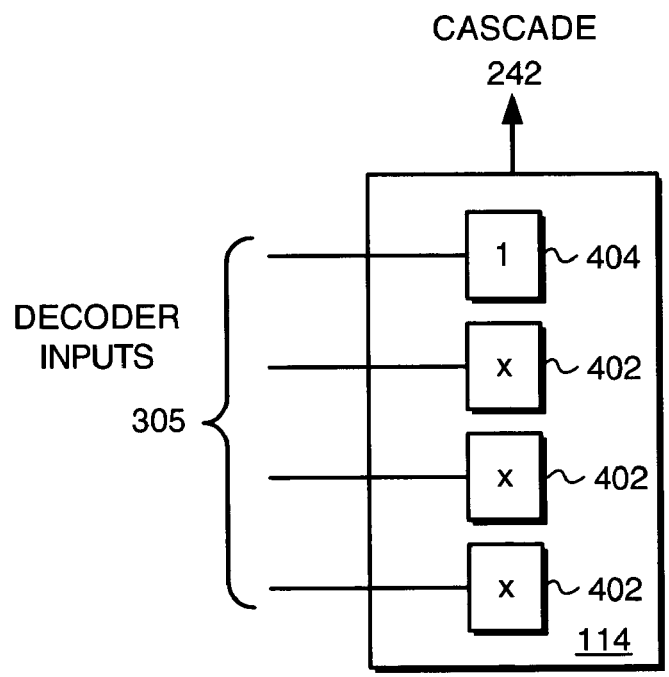
FIG. 5 is a block diagram showing a decoder consistent with the present invention configured in function unit cascade mode.

FIG. 5 is a block diagram showing a decoder consistent with the present invention configured in function unit cascade mode. When the decoder 114 is configured in cascade mode, cascade output 242 is preferably connected through the interconnect matrix 102 to the LSB input of another specialized macrocell in shift register mode, so that the most significant bit ("MSB") of the first shift register is essentially shifted out of the first shift register and into the second shift register. By cascading, a shift register of arbitrary size can be constructed. In one embodiment, the shift register cascade output 242 is the ordinary decoder output, and the configuration cells 402 are all programmed as "don't care", with the exception of the most significant configuration cell 404. In this way, the output of the decoder corresponds to the current most significant bit in the shift register. Accordingly, the cascade output can be provided through the interconnect matrix through either the macrocell register in the specialized macrocell, or by way of the value rail through a macrocell register in another macrocell in the same function block, to another shift register in the programmable logic device.

Further, in counter mode, the decoder is preferably configured so that each of the configuration cells 404 and 402 is a logic 1 and, thus, the output of the decoder is asserted when the counter overflows. The cascade output 242 is provided to the CE 254 input of another specialized macrocell in counter mode so that the more significant counter only counts when the counter beneath it overflows through the cascade output 242. By cascading counters, a counter of arbitrary size can be constructed.

Programmable logic devices utilizing the configurable function units consistent with the present invention permit realization of greater logic density than programmable devices that do not provide configurable function units and instead, for example, implement a counter or shift register in standard programmable logic. Further, the configurable function units are faster than counters or shift registers implemented in standard programmable logic, because of delays associated with routing signals between programmable modules within a programmable device.

Accordingly, dedicated circuitry consistent with the present invention frees up programmable logic resources that are better utilized for other custom logic. A further benefit of configurable function units is that devices employing them are able to provide the functionality of larger, more expensive programmable devices at a lower cost.

It is understood that a configurable function unit consistent with the present invention can be placed in a programmable logic device in various locations. Such a function unit can be realized at the function block level. Alternatively, it can be implemented separately from a particular function block and connect into the programmable component through a switch such as the Advanced Interconnect Matrix provided in some Xilinx devices. Configurable function units consistent with the present invention can also be provided in connection with other programmable logic devices, such as field programmable gate arrays.

The above description of exemplary embodiments is intended to be illustrative and not limiting. Other embodiments of this invention will be apparent to those skilled in the art in view of the above disclosure.

What is claimed is:

1. An integrated circuit comprising:
   a configurable function unit including a configurable function unit component; and
   at least one configurable decoder having decoder configuration data and a decoder output, the configurable decoder being operable to decode a value in data presented by the configurable function unit component;
   wherein the configurable decoder is optimized to assert the decoder output based on a comparison of the decoder configuration data with the value presented by the configurable function unit component;
   wherein the decoder configuration data is specified by configuring decoder cells having cell values of binary logic one, and binary logic zero;
   wherein the decoder output is asserted when the value presented by the configurable function unit component are consistent with the cell values; and
   wherein the decoder cells can further have cell values of "don't care".

2. The integrated circuit of claim 1, wherein the configurable function unit is a first configurable function unit, further comprising a second configurable function unit, wherein a cascade output of the configurable decoder is provided to the second configurable function unit to facilitate combining the first configurable function unit with the second configurable function unit.

3. The integrated circuit of claim 2, wherein the cascade output is the decoder output.

4. The integrated circuit of claim 1, wherein the integrated circuit is a field programmable gate array (FPGA) including at least one look-up table.

5. The integrated circuit of claim 1, wherein the integrated circuit is a complex programmable logic device (CPLD) having a plurality of function blocks, the function blocks including a plurality of macrocells.

6. The integrated circuit of claim 5, wherein the configurable function unit is associated with a predetermined function block of the function blocks of the CPLD.

7. The integrated circuit of claim 6, wherein the configurable function unit is logically contained within a predetermined macrocell in the macrocells.

8. The integrated circuit of claim 7, wherein the decoder output is synchronized with the CPLD by way of a macrocell register associated with the predetermined macrocell.

9. The integrated circuit of claim 7, wherein the predetermined macrocell of the macrocells has a set of control inputs that are substantially congruent with the control inputs of the remainder of the macrocells in the predetermined function block.

10. The integrated circuit of claim 7, wherein when it operates as a specialized macrocell, the predetermined macrocell of the macrocells utilizes control inputs that are substantially the same as the control inputs it utilizes when operating as a standard macrocell.

11. The integrated circuit of claim 7, wherein the predetermined macrocell in the macrocells is a buried macrocell.

12. The integrated circuit of claim 5, wherein an input of the configurable function unit comprises a configurable product term.

13. The integrated circuit of claim 1, wherein the configurable function unit component is a counter.

14. The integrated circuit of claim 13, wherein the configurable decoder is operable to match a predetermined value one clock cycle before the configurable function unit component reaches the predetermined value.

15. The integrated circuit of claim 13, wherein the configurable decoder is operable to match a specified terminal value and, based on reaching the specified terminal value, to cause a reset of the configurable function unit component.

16. The integrated circuit of claim 15, wherein the reset is an asynchronous reset.

17. The integrated circuit of claim 13, wherein the decoder output is synchronized and provided to the logical interconnection network.

18. The integrated circuit of claim 1, wherein the configurable function unit component is a shift register.

19. The integrated circuit of claim 18, wherein the configurable decoder is operable to match a predetermined value within the shift register one clock cycle before the shift register contains a particular shift register value by decoding all bits in the shift register excluding the most significant bit and concatenated with the bit value of a shift-in input to the shift register.

20. The integrated circuit of claim 1, wherein the configurable function unit component is a cyclic redundancy check generator (CRC generator).

21. The integrated circuit of claim 1, wherein the configurable function unit component is a serial encrypter.

22. The integrated circuit of claim 1, wherein the configurable function unit component is a feedback shift register.

23. The integrated circuit of claim 1, wherein the configurable function unit component is an accumulator.

24. A programmable logic device comprising:
    programmable logic;
    a counter providing a counter value;
    a decoder configurable to provide an output signal in response to a selected counter value; and
    an interconnect matrix for interconnecting the programmable logic, and receiving the output signal;
    wherein the decoder comprises decoder cells capable of having decoder cell values of one, zero, and "don't care".

25. The programmable logic device of claim 24, wherein a cascade output of the decoder is provided to the programmable logic device to facilitate combining the counter with at least one other counter in the programmable logic device.

26. The programmable logic device of claim 25, wherein the cascade output is the output signal, and the decoder is configured to provide the cascade output when the counter value is all logical ones.

27. The programmable logic device of claim 26, wherein the cascade output is asserted one clock cycle before the counter value is all logical ones.

28. The programmable logic device of claim 24, wherein the decoder is configured with a terminal count whereby the counter is reset when the counter value matches the terminal count.

29. The programmable logic device of claim 28, wherein the terminal count is decoded one clock cycle before the terminal count is reached.

30. The programmable logic device of claim 28, wherein the counter is reset synchronously.

31. The programmable logic device of claim 28, wherein the counter is reset asynchronously.

32. The programmable logic device of claim 28, wherein the counter is controlled by a clock enable.

33. The programmable logic device of claim 24, wherein the programmable logic device is a field programmable gate array (FPGA) including at least one look-up table.

34. The programmable logic device of claim 24, wherein the programmable logic device is a complex programmable logic device (CPLD) having a plurality of function blocks, the function blocks including a plurality of macrocells.

35. A programmable logic device comprising:
programmable logic;
a shift register providing a shift register value;
a decoder configurable to provide an output signal in response to a selected shift register value; and
an interconnect matrix for interconnecting the programmable logic, and receiving the output signal;
wherein the decoder comprises decoder cells capable of having decoder cell values of one, zero, and "don't care".

36. The programmable logic device of claim 35, wherein a shift cascade output of the decoder is provided to the programmable logic device to facilitate combining the shift register unit with at least one other shift register in the programmable logic device.

37. The programmable logic device of claim 36, wherein the shift cascade output is the output signal and the decoder is configured with "don't care" cells in all but a most significant bit of the decoder cell values, and with a one in the most significant bit of the decoder cell values, whereby the decode result represents the most significant bit in the shift register unit as the most significant bit in the shift register unit is shifted out of the shift register unit.

38. The programmable logic device of claim 37, wherein the shift cascade output corresponds to the next-to-most-significant bit in the shift register.

39. The programmable logic device of claim 35, wherein the programmable logic device is a field programmable gate array (FPGA) including at least one look-up table.

40. The programmable logic device of claim 35, wherein the programmable logic device is a complex programmable logic device (CPLD) having a plurality of function blocks, the function blocks including a plurality of macrocells.

41. A CPLD having interconnectable programmable logic, configuration memory, and external inputs and outputs, the interconnectable programmable logic being connected by a logical interconnection matrix and the CPLD comprising:
a configurable function unit including a configurable function unit component; and
a configurable decoder operable to assert a decoder output upon detecting a decode value in data presented by the configurable function unit component;
wherein the configurable function unit is logically internal to a predetermined specialized macrocell logically within the predetermined function block; and
wherein the decoder output is synchronized by and provided to the rest of the CPLD through a macrocell register associated with the predetermined specialized macrocell.

42. The CPLD of claim 41, wherein a decoder configuration associated with the configurable decoder comprises decoder cells, which are configured to match output bits of the configurable function unit component corresponding to binary logic one, binary logic zero, and corresponding to a value that matches either binary logic one, binary logic zero, or that matches both binary logic one and binary logic zero.

43. The CPLD of claim 41, wherein the configurable function unit is logically internal to a predetermined function block of the CPLD.

44. The CPLD of claim 41, wherein the decoder output is provided via a value rail to at least one macrocell in the predetermined function block other than the predetermined specialized macrocell.

45. The CPLD of claim 41, wherein the decoder output is synchronized by and provided to the rest of the CPLD through a macrocell register in a macrocell other than the predetermined specialized macrocell.

46. A programmable logic device having configuration memory and interconnectable programmable logic connected by a logical interconnection network, wherein at least a portion of the interconnectable programmable logic comprises macrocells, the programmable logic device comprising:
a configurable function unit including a function unit component and at least one configurable decoder programmable to decode a particular value as stored in the configuration memory when the particular value is presented by the function unit component, wherein the configurable function unit is located in a predetermined specialized macrocell of the programmable logic device; and
a plurality of logical function unit inputs associated with the predetermined specialized macrocell, the logical function unit inputs performing substantially the same functions as macrocell control inputs associated with the conventional macrocells.

* * * * *